US009478688B2

(12) United States Patent
Kanbara

(10) Patent No.: US 9,478,688 B2
(45) Date of Patent: Oct. 25, 2016

(54) ATTACHMENT MEMBER AND SOLAR CELL ARRAY USING SAME

(75) Inventor: Tatsuji Kanbara, Ebina (JP)

(73) Assignee: KYOCERA Corporation, Kyoto (JP)

( * ) Notice: Subject to any disclaimer, the term of this patent is extended or adjusted under 35 U.S.C. 154(b) by 276 days.

(21) Appl. No.: 14/122,868

(22) PCT Filed: May 31, 2012

(86) PCT No.: PCT/JP2012/064058
§ 371 (c)(1),
(2), (4) Date: Feb. 3, 2014

(87) PCT Pub. No.: WO2012/165538
PCT Pub. Date: Dec. 6, 2012

(65) Prior Publication Data
US 2014/0174510 A1      Jun. 26, 2014

(30) Foreign Application Priority Data

May 31, 2011   (JP) ................................. 2011-122442

(51) Int. Cl.
*A47B 97/00* (2006.01)
*H01L 31/048* (2014.01)
(Continued)

(52) U.S. Cl.
CPC ......... *H01L 31/0482* (2013.01); *F16B 5/0607* (2013.01); *F24J 2/526* (2013.01); *F24J 2/5211* (2013.01); *F24J 2/5245* (2013.01); *F24J 2/5258* (2013.01); *F24J 2/5264* (2013.01);
(Continued)

(58) Field of Classification Search
CPC ...... F24J 2/5258; F24J 2/5262; F24J 2/5207; H01L 31/0482; Y10T 403/30; Y02B 10/12
See application file for complete search history.

(56) References Cited

U.S. PATENT DOCUMENTS 1,281,531 A * 10/1918 Dietrich .................... F16L 3/24
                                                          248/228.5
8,938,932 B1 * 1/2015 Wentworth ............. H02S 20/23
                                                          52/173.3
(Continued)

FOREIGN PATENT DOCUMENTS

JP     2006-057357 A       3/2006
JP     2009007773 A  *    1/2009

OTHER PUBLICATIONS

Machine Translation of JP 2009-007773.*
(Continued)

*Primary Examiner* — Amy Sterling
(74) *Attorney, Agent, or Firm* — Procopio Cory Hargreaves and Savitch LLP

(57) ABSTRACT

An attachment member and a solar cell array are disclosed. The attachment member includes a first member; a second member on the first member; and a fixing member that fixes the first and second members. The first member includes a bottom portion; two first side walls facing each other. The second member includes a top portion; two second side walls facing to each other. The first and the second side walls are alternately arranged and face to each other. Each of the first and second side walls comprises an engagement portion. The engagement portion of one of the first side walls adjustably engages in height direction with the engagement portion of one of the second side walls. The engagement portion of the other one of the first side walls adjustably engages in height direction with the engagement portion of the other one of the second side walls.

8 Claims, 12 Drawing Sheets

(51) Int. Cl.
  *F24J 2/52*     (2006.01)
  *F16B 5/06*     (2006.01)
  *H01L 31/05*    (2014.01)
  *H01L 31/042*   (2014.01)
  *H02S 20/23*    (2014.01)
  *F24J 2/00*     (2014.01)
  *F24J 2/46*     (2006.01)

(52) U.S. Cl.
  CPC ........... *H01L31/0508* (2013.01); *H02S 20/00* (2013.01); *H02S 20/23* (2014.12); *F24J 2002/0046* (2013.01); *F24J 2002/4672* (2013.01); *Y02B 10/12* (2013.01); *Y02E 10/47* (2013.01); *Y10T 403/30* (2015.01)

(56) References Cited

U.S. PATENT DOCUMENTS

2012/0009009 A1*  1/2012  Bub .................... E04H 12/2276
                                                    403/204
2012/0097807 A1*  4/2012  Rees ...................... F24J 2/5203
                                                    248/121

OTHER PUBLICATIONS

International Search Report dated Aug. 21, 2012, issued for International Application No. PCT/JP2012/064058.

\* cited by examiner (a)

(b)

ATTACHMENT MEMBER AND SOLAR CELL ARRAY USING SAME

TECHNICAL FIELD

The present invention relates to attachment members for a solar cell module and a solar cell array using the attachment members.

BACKGROUND ART

A solar cell array includes attachment members and a plurality of solar cell modules fixed to the attachment members. A roof of a house or another installation surface to which the solar cell array is installed may be distorted. Thus, when a plurality of attachment members are installed, the height of the attachment members may be adjusted. In order to address this, a solar cell array equipped with engagement portions for adjusting the height of the attachment members has been proposed (see Patent Literature 1).

CITATION LIST

Patent Literature

PTL 1: Japanese Unexamined Patent Application Publication No. 2006-57357

SUMMARY OF INVENTION

In the solar cell array described in Patent Literature 1, a square pipe-shaped second member is disposed in a first member having a substantially U-shaped section, and a hook portion of the first member is hooked in a recess of the second member. In this state, the first member and the second member are fixed to each other with a screw inserted therethrough. Thus, in order to adjust the height of the attachment members, the screw needs to be removed from the first and second members, the second member needs to be removed from the first member, and then, the second member needs be inserted again. This makes installation work complex.

An object of the present invention is to provide an attachment member, which facilitates height adjustment, for a solar cell module and a solar cell array using the attachment member.

An attachment member according to an embodiment of the present invention includes a first member, as second member on the first member. The first member includes a bottom portion and two first side wall portions. The two first side wall portions face each other and extend upward from the bottom portion. The second member includes a top portion faces the bottom portion and two second side wall portions that face each other, and that extend downward from the upper portion. The attachment member further includes a fixing member that fixes the second member to the first member. In the attachment member, the two first side wall portions and the two second side wall portions are alternately arranged such that a main surface of one of the two first side wall portions faces a main surface of a corresponding one of the two second side wall portions and a main surface of the other one of the two first side wall portion faces a main surface of the other one of the two second side wall portions. At least one of the two first side wall portions includes a first engagement portion in the main surface thereof that faces a corresponding one of the two second side wall portions. At least one of the two second wall portions includes a second engagement portion, which is engaged with the first engagement portion, on the main surface thereof that faces a corresponding one of the two first side wall portions. The second engagement portion is engageable with the first engagement portion at a plurality of positions in a height direction of the first member.

A solar cell array according to another embodiment of the present invention includes a plurality of solar cell modules arranged in one direction such that the solar cell modules are not superposed with one another and the above-described attachment member disposed between, out of the plurality of solar cell module, two solar cell modules adjacent to each other in the one direction.

The height of an attachment member is easily adjustable with the above-described attachment member and the solar cell array using the above-described attachment member.

DESCRIPTION OF EMBODIMENTS

An attachment member for a solar cell module and a solar cell array according to embodiments of the present invention will be described below with reference to the drawings.

<First Embodiment>

Figure 1:
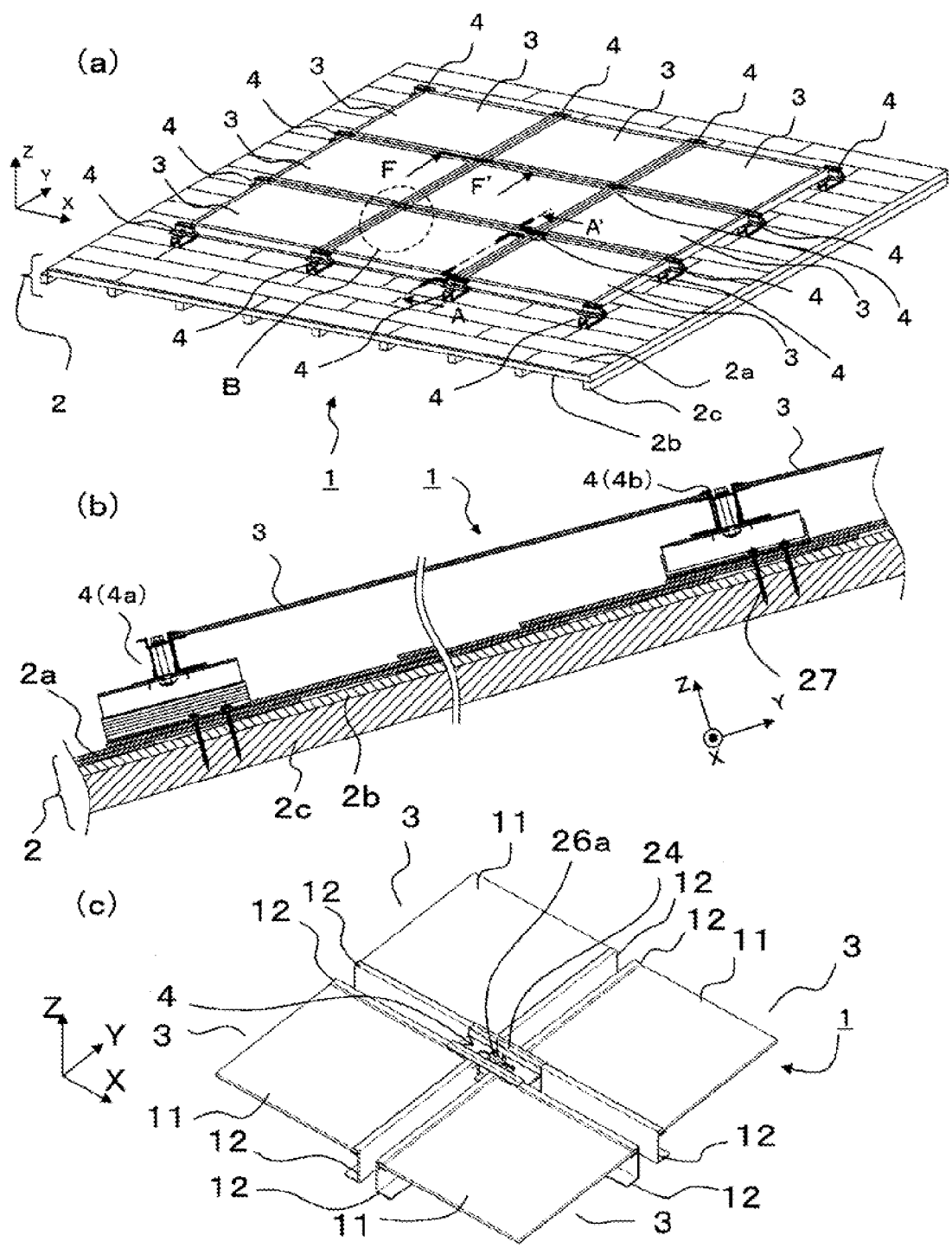
FIG. 1 includes the following views of an example of a solar cell array according to a first embodiment of the present invention: view (a) that is a perspective view; view (b) that is a sectional view taken along line A-A' in view (a) of FIG. 1; and view (c) that is an enlarged view of part B in view (a) of FIG. 1.

Referring to views (a) and (b) of FIG. 1, a solar cell array 1 includes a plurality of solar cell modules 3 and attachment members 4. The attachment members 4 are used to attach the plurality of solar cell modules 3 onto an installation surface. The solar cell modules 3 are fixed onto, for example, an inclined surface (roof surface) of a base 2 with the attachment members 4. The base 2 includes shingles 2a, sheathing roof boards 2b, and rafters 2c. That is, this inclined surface serves as the installation surface of the solar cell array 1.

In the present embodiment, as illustrated in view (a) to (c) of FIG. 1, the plurality of solar cell modules 3 are arranged in the Y-direction (inclination direction of inclined surface) and in the X-direction, which is perpendicular to the Y-direction. In the following description, an eave side refers to a lower side in the Y-direction and a ridge side refers to an upper side in the Y-direction. That is, the eave side represents the −Y-direction and the ridge side represents the +Y-direction.

<Solar Cell Module>

Figure 2:
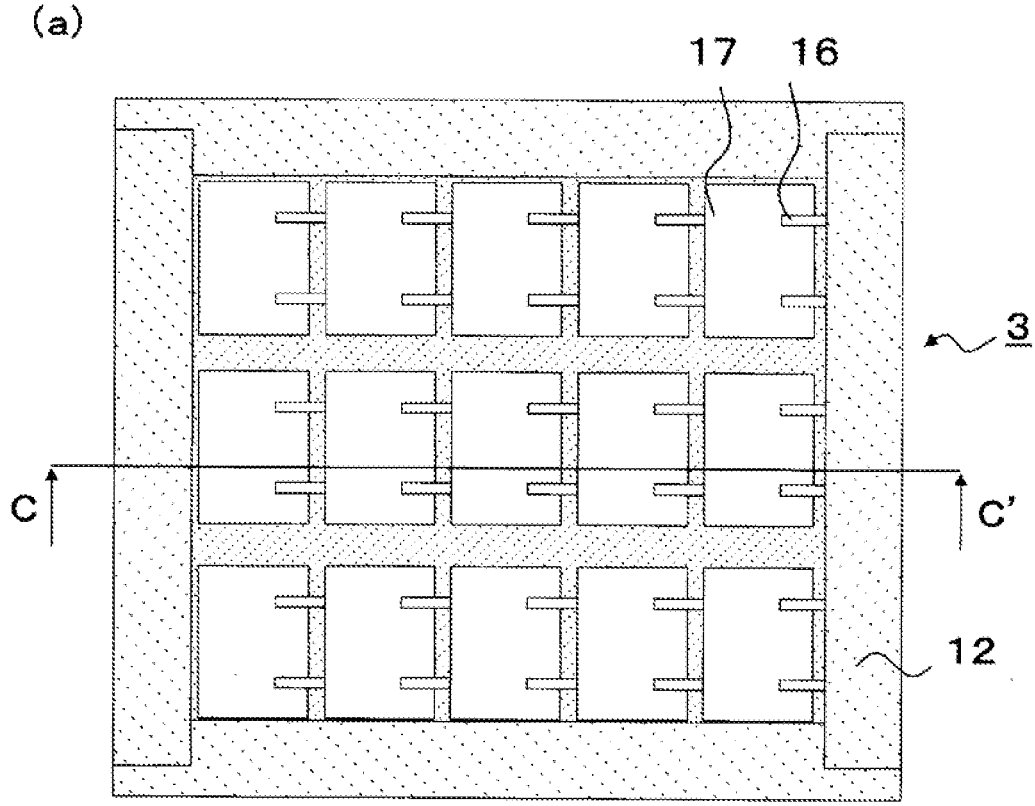
FIG. 2 includes the following views of an example of a solar cell module used in the solar cell array illustrated in FIG. 1: view (a) that is a plan view; and view (b) that is sectional view taken along line C-C' in view (a) of FIG. 2.
Figure 2:
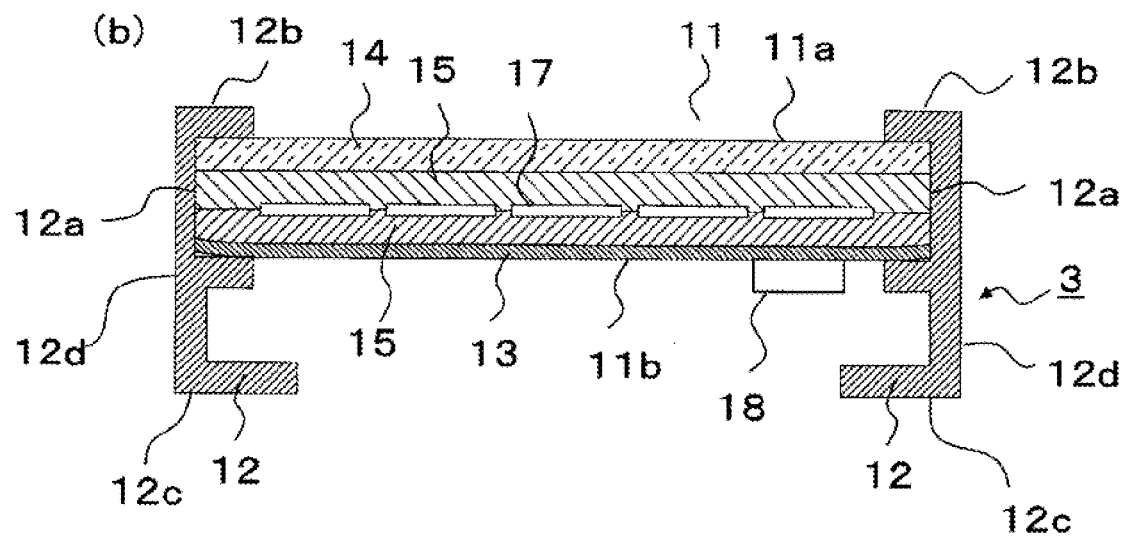

As illustrated in FIG. 2, each solar cell module 3 includes a solar cell panel 11 and frames 12.

As illustrated in view (b) of FIG. 2, the solar cell panel 11 includes a front surface 11a (one of main surfaces of a translucent substrate 14) and a rear surface 11b (one of main surfaces of a rear surface protection member 13). Light is mainly received by the front surface 11a. The rear surface 11b is a rear surface of the front surface 11a. The solar cell panel 11 includes the translucent substrate 14, a pair of filler members 15, a plurality of solar cell elements 17, the rear surface protection member 13, and a terminal box 18.

The translucent substrate 14 functions as a substrate of the solar cell module 3. The pair of filler members 15 are formed of, for example, thermosetting resin. Regions around the plurality of solar cell elements 17 are protected by the filler members 15. The solar cell elements 17 are electrically connected to one another by inner leads 16. The rear surface protection member 13 protects the rear surface of the solar cell module 3. Output obtained by the solar cell elements 17 is extracted to the outside through the terminal box 18.

The solar cell elements 17 each use, for example, a substrate formed of a single crystal silicon, a multicrystal silicon, or the like. When such silicon substrates are used, it is sufficient that the silicon substrates adjacent to each other be electrically connected to each other by the inner leads 16 as described above.

The type of the solar cell elements 17 is not particularly limited. The solar cell elements 17 use, for example, thin-film solar cells formed of amorphous silicon, CIGS solar cells, CdTe solar cells, solar cells formed of a thin amorphous film stacked on a crystal silicon substrate, or the like. For example, thin-film solar cells formed of amorphous silicon, CIGS solar cells, and CdTe solar cells may be formed by appropriately stacking an amorphous silicon layer, a CIGS layer, and a CdTe layer, respectively, with a transparent electrode and the like on a translucent substrate.

The terminal box 18 includes a box body, a terminal plate, and an output cable, which are not shown. The terminal plate is disposed in the box body. Power is output to the outside of the box through the output cable. Examples of the material of the box body include, for example, modified polyphenylene ether resin (modified PPE resin) and polyphenyleneoxide resin (PPO resin).

The frames 12 hold the solar cell panel 11. As illustrated in views (a) and (b) of FIG. 2, the frames 12 have an elongated shape and reinforce an outer periphery of the solar cell panel 11. More specifically, the frames 12 each include an engagement portion 12a, a frame upper surface 12b, a frame lower surface 12c, and a frame side surface 12d. The engagement portion 12a is engaged with the solar cell panel 11 when the solar cell array 1 is installed. The installation of the solar cell array 1 will be described later. The frame upper surface 12b is a main surface positioned on a side where sun light is received. The frame lower surface 12c is a main surface positioned on a rear surface side of the frame upper surface 12b. The frame side surface 12d is connected to both the frame upper surface 12b and the frame lower surface 12c. Such a frame 12 can be produced by, for example, extruding aluminum.

<Attachment Member>

In the present embodiment, the attachment members 4 are disposed between corners of the adjacent solar cell modules 3. For example, as illustrated in view (c) of FIG. 1, a single attachment member 4 is disposed at a position where the corners of four solar cell modules 3 meet.

Figure 3:
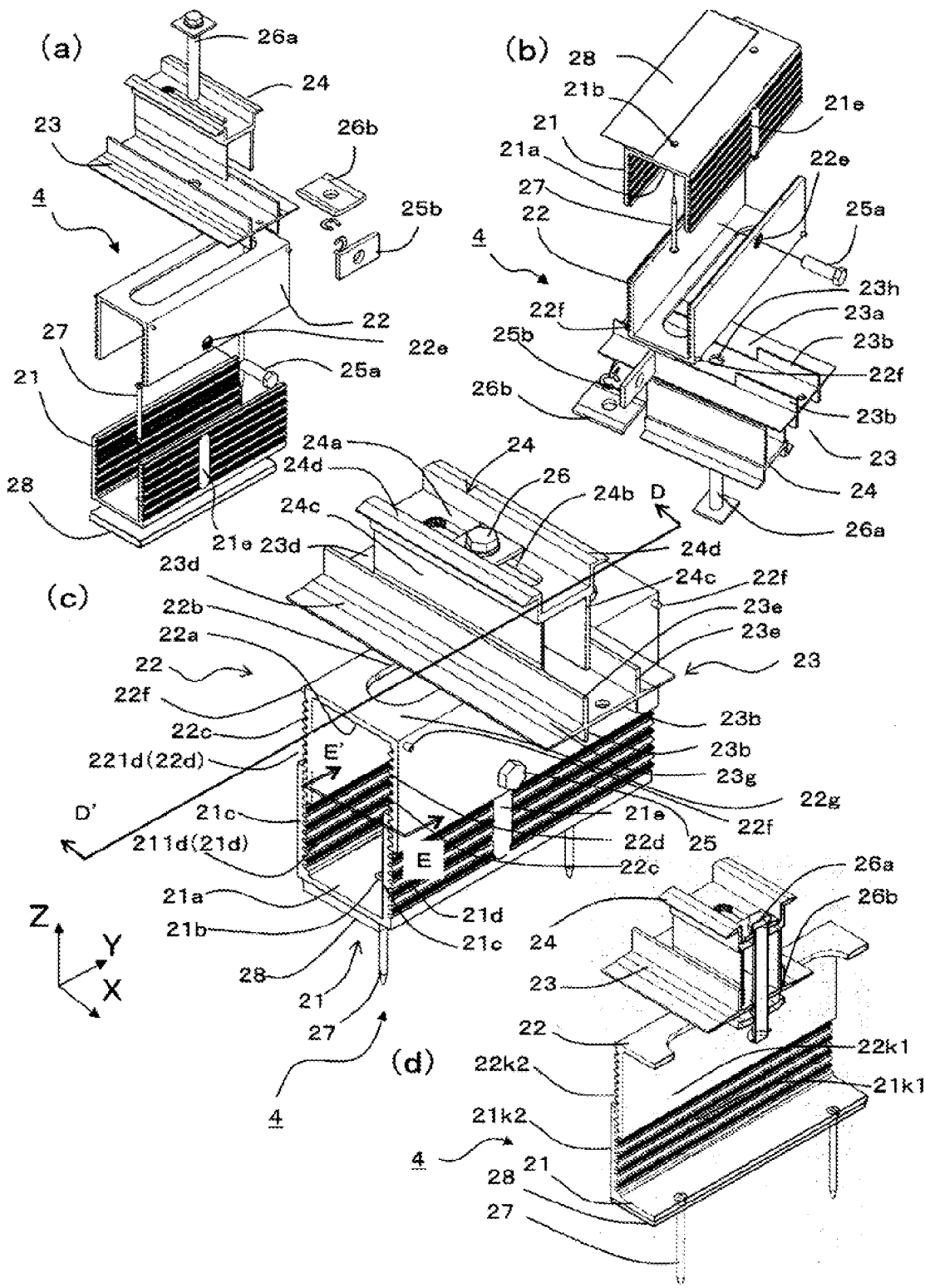
FIG. 3 includes the following views of an attachment member used in the solar cell array illustrated in FIG. 1: view (a) that is an exploded perspective view; view (b) that is an exploded perspective view illustrating the attachment member illustrated in view (a) of FIG. 3 seen from the rear side; view (c) that is a perspective view; and view (d) that is a sectional view taken along line D-D' in view (c) of FIG. 3.

The attachment members 4 each include at least, as illustrated in FIG. 3, a first member 21, a second member 22, and a first fixing member 25. The second member 22 is disposed on the upper side of the first member 21. The first fixing member 25 fixes the second member 22 to the first member 21. The first member 21 and the second member 22 are fixed to the base 2 by screws 27 such that the longitudinal directions of the first member 21 and the second member 22 extend in the Y-direction. In this state, the second member 22 is movable in the Z-direction.

In the present embodiment, the attachment member 4 also includes a third member 23 and a fourth member 24. The third member 23 and the fourth member 24 are movable in at least one of the X-direction and Y-direction.

In the present embodiment, as illustrated in views (a) and (b) of FIG. 3, the attachment member 4 includes the first member 21, the second member 22, the third member 23, the fourth member 24, the first fixing member 25, the second fixing member 26, screws 27, and an adhesive member 28.

As illustrated in views (c) and (d) of FIG. 3, the first member 21 and the second member 22 are combined with each other and fixed with the first fixing member 25 in the combined state. The fourth member 24 is disposed on the third member 23. The third member 23 and the fourth member 24 are fixed onto the second member 22 with the second fixing member 26. Thus, an assembly of the first to fourth members 21 to 24 is obtained. This assembly is fixed to the installation surface (surface of base 2) with the screws 27.

The adhesive member 28 is disposed between the first member 21 and the base 2. The gap between the first member 21 and the base 2 can be sealed with the adhesive member 28. Thus, the amount of rain water and the like penetrating into the base 2 along the screws 27 can be reduced.

<First Member>

As illustrated in FIG. 3, the first member 21 is, for example, an elongated member having a substantially U-shaped section.

The first member 21 is produced by, for example, extruding a metal such as an aluminum alloy. In the case where a material other than an aluminum alloy is used, the first member 21 is produced by, for example, roll forming or bending a stainless steel, a galvanized steel sheet, or the like.

The first member 21 includes, for example, a bottom portion 21a, first through holes 21b, two first wall portions 21c, and a first slotted hole 21e. The first member 21 is disposed such that the longitudinal direction of the first member 21 extends in the Y-direction.

The bottom portion 21a opposes the base 2 (inclined surface).

The first through holes 21b are formed in the bottom portion 21a. The screws 27 are inserted through the first through hole 21b. The attachment member 4 is fixed to the base 2 (inclined surface) by using the first through holes 21b. In the present embodiment, as illustrated in view (b) of FIG. 3, two first through holes 21b are arranged in the longitudinal direction (Y-direction) of the first member 21.

The two first wall portions 21c each extend upward from the bottom portion 21a. The two first wall portions 21c, for example as illustrated in FIG. 3, extend in a direction perpendicular to the bottom portion 21a from both end portions of the bottom portion 21a in the X-direction. It is sufficient that the size in the Z-direction of the first wall portions 21c be, for example, 40 to 80 mm. As illustrated in view (d) of FIG. 3, the two first wall portions 21c each include a first main surface 21k1 and a second main surface 21k2. The two first wall portions 21c each include a first engagement portion 21d in the first main surface 21k1. That is, the first engagement portions 21d are formed in the respective first main surfaces 21k1 (surfaces on the +X-direction side in view (c) of FIG. 3), which face the same direction, out of the main surfaces of the two first wall portions 21c.

Figure 4:
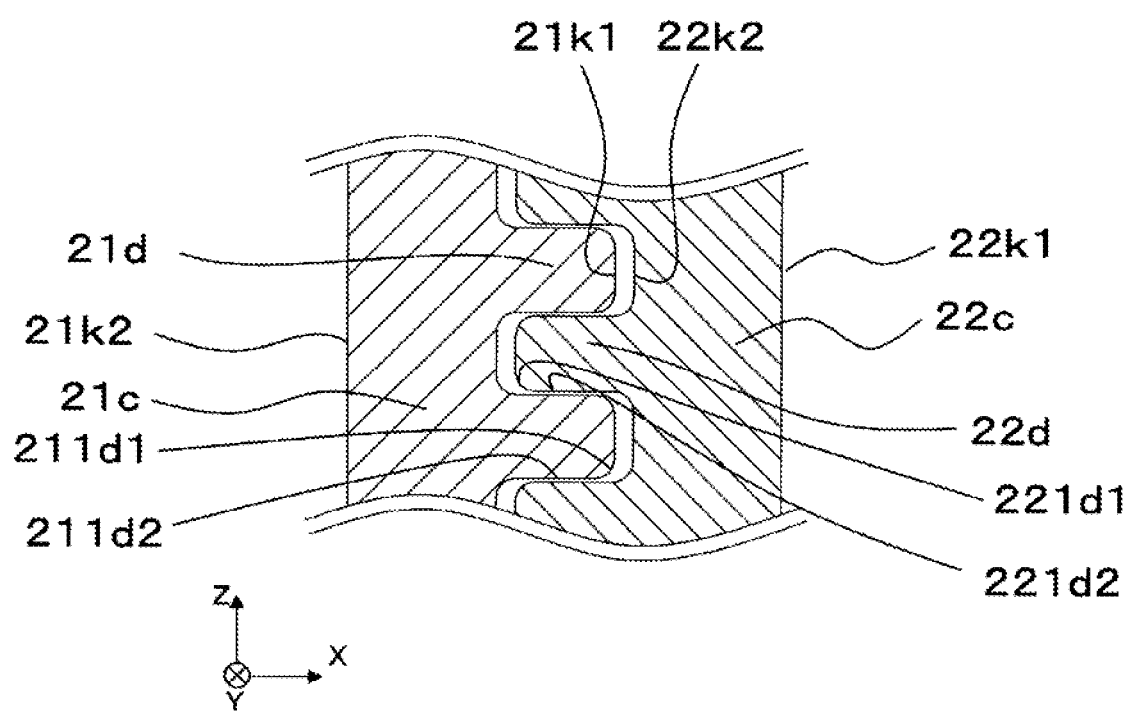
FIG. 4 is an enlarged view of part of the attachment member according to the first embodiment illustrating a section take along line E-E' in view (c) of FIG. 3.

In the present embodiment, the first engagement portions 21d each are a first serration in the first main surface 21k1 of the first wall portion 21c. That is, as illustrated in FIG. 4, the sectional shape of the first engagement portion 21d along the XZ plane has a serrated shape (sawtooth shape). In other words, the first engagement portion 21d includes a plurality of recesses and projections alternately formed in the plus Z-direction in the first main surface 21k1. It is sufficient that the sizes of these recesses and projections in the X- and Z-directions are, for example, 2 to 5 mm.

The first slotted hole 21e is formed in one of the two first wall portions 21c and elongated in the Z-direction. As illustrated in view (c) of FIG. 3, the first fixing member 25 inserted through a second through hole 22e is inserted through the first slotted hole 21e. The second through hole 22e will be described later. It is sufficient that the size of the first slotted hole 21e be appropriately set in accordance with the size of the first fixing member 25.

<Second Member>

As illustrated in FIG. 3, the second member 22 is, for example, an elongated member having a substantially U-shaped section. The second member 22 can be formed of a material similar to that of the first member with a processing method similar to that of the first member 21.

The second member 22 includes, for example, an upper portion 22a, an opening portion 22b, two second wall portions 22c, and the second through hole 22e. The second member 22 is disposed on the first member 21 such that the longitudinal direction of the second member 22 extends in the Y-direction.

As illustrated in view (c) of FIG. 3, the upper portion 22a opposes the bottom portion 21a of the first member 21 and is disposed above the bottom portion 21a of the first member 21.

The opening portion 22b is a hole formed in the upper portion 22a and elongated in the longitudinal direction of the second member 22.

The second through hole 22e is formed at a position of the second wall portion 22c in contact with the first slotted hole 21e of the first member 21.

The two second wall portions 22c each extend downward from the upper portion 22a. The two second wall portions 22c extend, for example, in a direction perpendicular to the upper portion 22a (Z-direction) from both end portions of the upper portion 22a in the X-direction. It is sufficient that the size in the Z-direction of the second wall portions 22c be, for example, 40 to 80 mm. The two second wall portions 22c each include a first main surface 22k1 and a second main surface 22k2. As illustrated in view (d) of FIG. 3, the second main surface 22k2 out of the both main surfaces of each second wall portion 22c opposes the first main surface 21k1 of a corresponding one of the first wall portions 21c of the first member 21. In other words, as illustrated in view (c) of FIG. 3, the first wall portions 21c and the second wall portions 22c are alternately arranged in a single direction (X-direction in the present embodiment). Thus, the second main surfaces 22k2 of the second wall portions 22c opposes the first main surfaces 21k1 of the first wall portions 21c.

The distance between the two second wall portions 22c are substantially the same as the distance between the two first wall portions 21c of the first member 21. Thus, when the first member 21 and the second member 22 are combined with each other such that the bottom portion 21a of the first member 21 and the upper portion 22a of the second member 22 oppose each other, the two first wall portions 21c and the two second wall portions 22c are alternately arranged while facing one another. In other words, one of the second wall portions 22c is in contact with one of the first wall portions 21c inside an opening of the first member 21, and the other second wall portion 22c is in contact with the other first wall portion 21c outside the opening of the first member 21. That is, part of the first main surface 21k1 of one of the first wall portions 21c opposes part of the second main surface 22k2 of a corresponding one of the second wall portions 22c, and part of the first main surface 21k1 of the other first wall portion 21c opposes part of the second main surface 22k2 of a corresponding one of the second wall portions 22c.

Each of the two second wall portions 22c includes a second engagement portion 22d, which is engaged with a corresponding one of the first engagement portions 21d, in the second main surface 22k2. That is, the second engagement portions 22d are formed in the respective second main surfaces 22k2 (surfaces on the minus X-direction side in view (c) of FIG. 3), which face the same direction, out of the main surfaces of the two second wall portions 22c. The second main surfaces 22k2 oppose the first main surfaces 21k1 of the first wall portions 21c.

As described above, with the second engagement portions 22d on the second main surfaces 22k2 on the sides in contact with the first engagement portions 21d, the first engagement portions 21d and the second engagement portions 22d can be engaged with one another. Thus, the second member 22 can be fixed to the first member 21 in the Z-direction, and a load applied to the attachment member 4 in the Z-direction can be supported by the first engagement portions 21d and the second engagement portions 22d.

In the present embodiment, the second engagement portions 22d each are a second serration in the second main surface 22k2 of the second wall portion 22c. That is, as illustrated in FIG. 4, the sectional shape of the second engagement portion 22d along the XZ plane has a serrated shape (sawtooth shape). In other words, the second engagement portion 22d includes a plurality of recesses and projections alternately formed in the Z-direction in the second main surface 22k2 (surface on the −X-direction in view (c) of FIG. 3).

It is sufficient that the shapes of the first engagement portion 21d of the first member 21 and the second engagement portion 22d of the second member 22 be engageable with each other. That is, although the projection and recess shapes of the second engagement portion 22d are similar to those of the first engagement portion 21d in the present embodiment, the shapes of the first engagement portion 21d and the second engagement portion 22d are not limited to these. It is sufficient that the first engagement portion 21d and the second engagement portion 22d be engageable with each other.

The first member 21 and the second member 22 are fixed to each other with the first fixing member 25 so that the first engagement portion 21d and the second engagement portion 22d are not disengaged from each other. The first fixing member 25 is, for example, as illustrated in view (a) of FIG. 3, inserted through the first slotted hole 21e and the second through hole 22e, thereby fixing the first wall portion 21c and the second wall portion 22c to each other.

As described above, in the present embodiment, with the second engagement portions 22d on the second main surfaces 22k2 on the sides in contact with the first engagement portions 21d, the first engagement portions 21d and the second engagement portions 22d can be engaged with one another. Thus, the second member 22 can be fixed to the first member 21 in the Z-direction, and a load exerted on the attachment member 4 in the Z-direction can be supported. In this state, the second engagement portion 22d is engageable with the first engagement portion 21d at a plurality of positions in the height direction (Z-direction) of the first member 21. Thus, by loosening the first fixing member 25, the second member 22 can be moved in the Z-direction without removing the first fixing member 25 and can be set at a desired height position relative to the first member 21. As a result, with the attachment member 4 that includes the first member 21, the second member 22, and the fixing member 25 according to the present embodiment, the solar cell module 3 can be substantially horizontally attached to the installation surface having irregularities.

It is sufficient that the first engagement portion 21d and the second engagement portion 22d be fixed to each other with the first fixing member 25 such that a state in which the first engagement portion 21d and the second engagement portion 22d are not disengaged from each other can be maintained. That is, the first slotted hole 21e and the second through hole 22e be respectively formed at least in one of the first wall portions 21c and one of the second wall portions 22c as is the case with the present embodiment. In other words, it is sufficient that one of the first wall portions 21c and a corresponding one of the second wall portions 22c be fixed to each other with the first fixing member 25. This facilitates installation compared to the case where the first fixing member 25 crosses entirely through the sections of the substantially U shapes of the first member 21 and the second member 22 for fixing. Furthermore, reduction in the engagement force due to the sections of the U shapes of the first member 21 and the second member 22 being pressed can be reduced.

As described above, in the present embodiment, the first member 21 fixed with the first fixing member 25 includes the first slotted hole 21e elongated in the height direction (Z-direction). The first wall portion 21c and the second wall portion 22c are fixed to each other with the first fixing member 25 inserted through the first slotted hole 21e. Since the first slotted hole 21e, through which the first fixing member 25 is inserted, is elongated in the Z-direction as described above, it is ensured that a range of a position where the second member 22 is fixed in the height direction can be increased.

Examples of the shapes of the first engagement portion 21d and the second engagement portion 22d include, for example, a comb-like shape. The first engagement portion 21d and the second engagement portion 22d each may have a serrated shape. With such forms, the shapes of the first member 21 and the second member 22 are simple. Thus, the processing cost of the attachment member 4 can be reduced. Also with such forms, for example, extruded aluminum can be used. This facilitates production of each member.

In the present embodiment, as illustrated in FIG. 4, in a section perpendicular to the corresponding wall portions, the first engagement portion 21d (first serration) includes horizontal surface portions 211d2 and curved surface portions 211d1, and the second engagement portion 22d (second serration) includes flat surface portions 221d2 and curved surface portions 221d1. With such a structure, a self-weight exerted in the Z-direction on the attachment member 4 can be more stably supported.

Furthermore, in the present embodiment, the first engagement portion 21d and the second engagement portion 22d have an elongated serration shape extending in the Y-direction and are formed of a plurality of projections and recesses. Thus, the first engagement portion 21d and the second engagement portion 22d are engaged while being in contact with each other is in a large area. That is, since the flat surface portions are in contact with one another, a load to be supported can be distributed. As a result, the self-weight exerted in the Z-direction on the attachment member 4 can be firmly supported.

In the present embodiment, part of a surface on an upper side of the upper portion 22a of the second member 22 is a support surface 22g that supports the third member 23, which will be described later. The opening portion 22b elongated in the Y-direction is formed in this support surface 22g. As illustrated in view (d) of FIG. 3, the second fixing member 26 used to fix the third member 23, which will be described later, and the fourth member 24 is inserted through the opening portion 22b. This allows the third member 23 and the fourth member 24 to be moved in the Y-direction.

Also in the present embodiment, as illustrated in view (c) of FIG. 3, the two second wall portions 22c of the second member 22 each include projections 22f near positions of each main surface that faces outward, the positions located at both end in the Y-direction. That is, in the second member 22, one of the second wall portions 22c including the second through hole 22e includes two projections 22f on its first main surface 22k1, and the other second wall portion 22c that includes the second engagement portion 22d includes two projections 22f on its second main surface 22k2. As illustrated in view (b) of FIG. 3, such projections 22f are interfered with first fins 23b of the third member 23, which will be described later. This can suppress detachment of the third member 23 from the second member 22.

<Third Member>

The third member 23 includes a first main surface 23a, a second main surface 23d, the first fins 23b, and second fins 23e. The first fins 23b and the second fins 23e are respectively formed on the first main surface 23a and the second main surface 23d.

The first main surface 23a opposes the second member 22. The second main surface 23d is positioned on the rear side of the first main surface 23a and opposes the fourth member 24, which will be described later.

The first fins 23b function as guide portions that guide the movement of the third member 23 in the longitudinal direction of the second member 22. The first fins 23b are defined by, for example, a pair of first projections spaced apart from each other and disposed on both side of the first main surface 23a in the width direction (X-direction) on the third member 23. In the present embodiment, two pairs of the above-described first projections are provided. It is sufficient that the distance between the pair of the first projections is equal to or more than the dimension of the second member 22 in the X-direction.

The second fins 23e function as guide portions that guide the movement of the fourth member 24 in the longitudinal direction (X-direction) of the third member 23. The second fins 23e are defined, for example, by a pair of second projections extending in the longitudinal direction (X-direction) of the third member 23 on the second main surface 23d. The distance between the pair of the second projections is equal to or more than the dimension of the fourth member 24 in the width direction (Y-direction).

As described above, the third member 23 is a plate-shaped body that includes plurality of fins formed in the longitudinal direction on both the main surfaces. With respect to the second member 22, the third member 23 is disposed such that the longitudinal direction of the third member 23 is perpendicular to the longitudinal direction of the second member 22.

Desirably, the distance between the pair of first projections is substantially the same as the dimension of the second member 22 in the width direction. This allows the third member 23 to be smoothly moved in the Y-direction on the second member 22 without being rotated. Furthermore, misalignment caused by the rotation of the third member 23 can be reduced while tightening the second fixing member 26.

Desirably, the distance between the pair of second projections is substantially the same as the dimension of the fourth member 24 in the width direction. With this, the fourth member 24 allows the second fins 23e to be smoothly moved in the longitudinal direction of the third member 23.

The fourth member 24 is moved in a portion between the pair of the second fins 23e on the second main surface 23d. In the second main surface 23d, a portion outside each of the second fins 23e defines a mount portion 23g where the solar cell module 3 is mounted.

The third member 23 can be formed of a material similar to that of the first member 21 with a processing method similar to that of the first member 21.

<Fourth Member>

The fourth member 24 is, for example, a rail having a substantially T-shaped section. The fourth member 24 is disposed such that the longitudinal direction of the fourth member 24 is parallel to the longitudinal direction of the third member 23. The fourth member 24 is fixed to the third member 23 such that the longitudinal direction of the fourth member 24 is perpendicular to the longitudinal direction of the second member 22.

The fourth member 24 includes, for example, an upper surface portion 24a, side wall portions 24c, a third slotted hole 24b, and pressure fixing portions 24d. The third slotted hole 24b is formed in the upper surface portion 24a. The pressure fixing portions 24d project beyond the side wall portions 24c.

The second fixing member 26 is inserted through the third slotted hole 24b. The third slotted hole 24b is used to fix the third member 23 and the fourth member 24 to each other. The third slotted hole 24b allows the movement of the fourth member 24 within the size thereof while the second fixing member 26 remains attached. That is, when the second fixing member 26 is loosened, the fourth member 24 is movable relative to the third member 23.

Before the third member 23 and the fourth member 24 are fixed to each other with the second fixing member 26, the third member 23 is movable in the Y-direction. Also, the fourth member 24 is movable in the X- and Y-directions. This allows fine adjustment of the position of the solar cell module 3 to be performed in the X- and Y-directions.

The pressure fixing portions 24d cooperate with the mount portions 23g of the third member 23 to clamp the frame 12 of the solar cell module 3.

The fourth member 24 can also be formed of a material similar to that of the first member with a processing method similar to that of the first member 21.

<First Fixing Member>

The first fixing member 25 includes, for example, a bolt 25a, a female thread member 25b, and the like. The bolt 25a is inserted through the first slotted hole 21e and the second through hole 22e and fixed to the female thread member 25b. Thus, the second member 22 is movable in the Z-direction when the first fixing member 25 is loosened. The first fixing member 25 may be formed of a stainless steel or a galvanized steel. This improves corrosion resistance of the first fixing member 25. The female thread member 25b can be formed by, for example, pressing or tapping.

<Second Fixing Member>

The second fixing member 26 includes, for example, a bolt 26a, a female thread member 26b, and the like. The bolt 26a is inserted through the slotted hole 24b and a bolt hole 23h and fixed to the female thread member 26b at a position further inward than the opening portion 22b of the second member 22. Thus, the third member 23 is movable in the longitudinal direction of the second member 22 (Y-direction) when the second fixing member 26 is loosened. Also, the fourth member 24 is movable in the longitudinal direction of the third member 23 (X-direction). The second fixing member 26 can be formed of a material similar to that of the first fixing member 25 with a processing method similar to that of the first fixing member 25.

<Screw>

The screws 27 are inserted through the first through holes 21b of the first member 21 and fix the first member 21 to the base 2. The screws 27 are desirably formed of, for example, a stainless steel or a galvanized steel.

<Adhesive Member>

The adhesive member 28 is bonded to the bottom portion 21a of the first member 21 and protects fixed portions around the screws 27 from rainwater, moisture, or the like when the first member 21 is fixed to the base 2. The adhesive member 28 is formed of a member having adhesive properties, for example, a silicone sealant sheet or a butyl sheet cut into strips.

<Installation Method>

Next, a procedure for installing the solar cell array 1 according to the embodiment of the present invention is described.

Initially, positions on the base 2 where the attachment members 4 are to be installed are marked with ink or the like. Next, the first members 21 are aligned with the above-described marks, bonded to the base 2 with the adhesive members 28, and fixed to the base 2 with the screws 27.

Next, the first members 21 and the second members 22 are loosely fixed with the first fixing member 25. Next, the second members 22, the third members 23, and the fourth members 24 are loosely fixed with the second fixing members 26. Thus, the attachment members 4 are assembled. In this state, the first engagement portions 21$d$ and the second engagement portions 22$d$ are desirably engaged with one another such that the second members 22 are positioned at the lowest position relative to the respective first members 21.

Next, leveling lines are stretched between the attachment members 4 positioned at both ends of rows of the attachment members 4 arranged in a direction (X-direction) perpendicular to the inclination direction of the base 2. The height of the attachment members 4 arranged in each row other than those positioned at both the ends of the row is adjusted with reference to the leveling lines.

A procedure in which the height of the mount portions 23$g$ of the third members 23 in the attachment members 4 is adjusted is described in detail below with reference to FIG. 5.

<Method of Adjusting Height>

Figure 5:
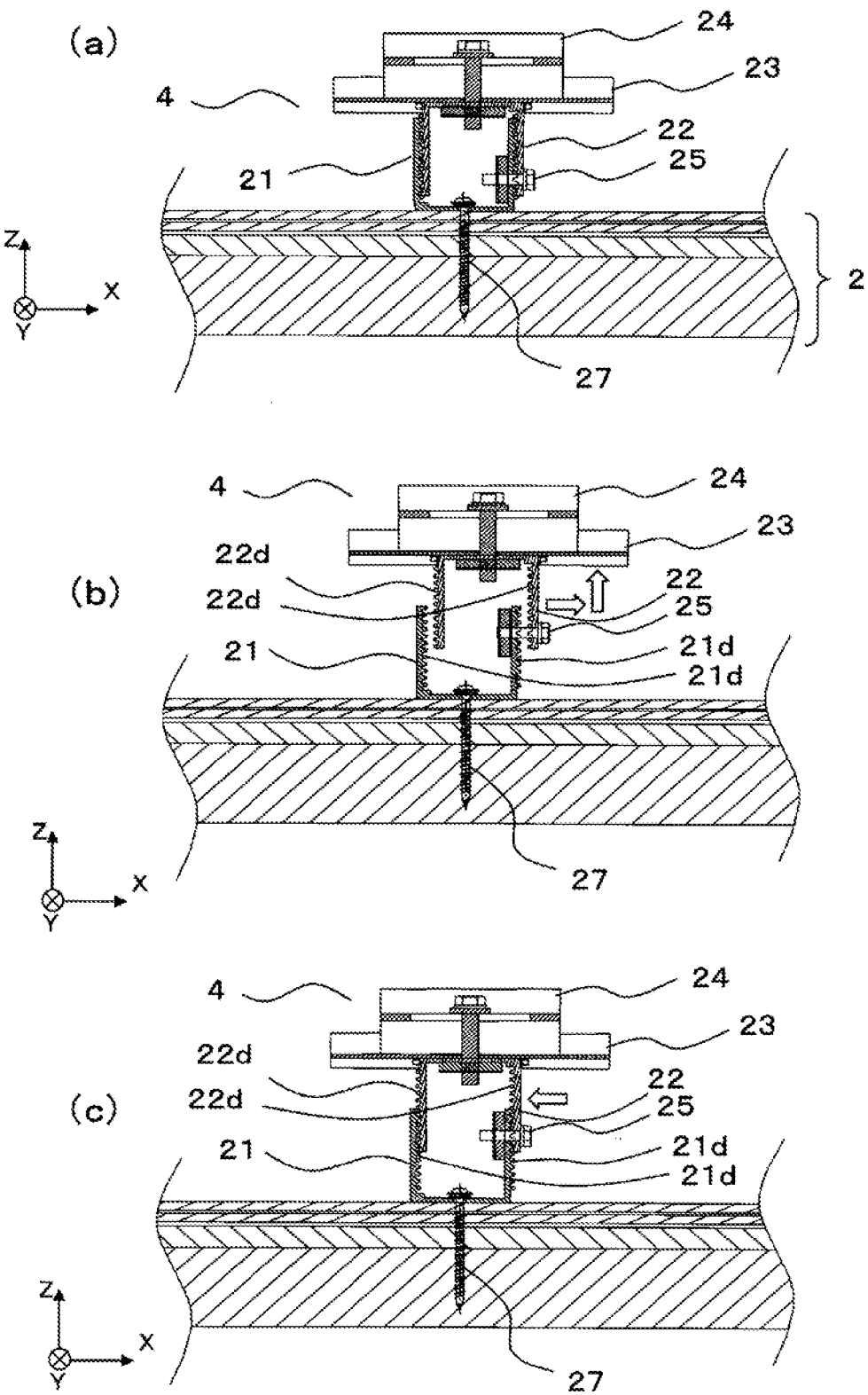
FIG. 5 includes sectional views (a) to (c) taken at a position corresponding to section F-F' in view (a) of FIG. 1 explaining installation steps of the attachment member according to the first embodiment in the order from (a) to (c).

Initially, the first fixing member 25 in the attachment member 4 illustrated in view (a) of FIG. 5 is loosened, and, as illustrated in view (b) of FIG. 5, the first engagement portions 21$d$ and the second engagement portions 22$d$ are disengaged from one another. Next, the position (position in the Z-direction) of the second member 22 is shifted upward, and the height of the second member 22 is adjusted.

By doing this, as illustrated in view (b) of FIG. 5, the first engagement portions 21$d$ and the second engagement portions 22$d$ can be disengaged from one another without removing the first fixing member 25 from the first slotted hole 21$e$. Thus, according to the present embodiment, the engagement portions corresponding to one another are disengaged from one another by loosening the fixing member (first fixing member 25). This allows the height of the attachment member 4 to be adjusted without removing the second member 22 from the first member 21.

Furthermore, in the present embodiment, since the first engagement portions 21$d$ and the second engagement portions 22$d$ include unevenness, even when the first fixing member 25 is lightly hand-tightened, the second member 22 can be temporarily fixed in the Z-direction. This facilitates adjustment in the height direction.

Next, as illustrated in view (c) of FIG. 5, the first engagement portions 21$d$ and the second engagement portions 22$d$ are engaged with one another at a desired height, and after that, the second member 22 is fixed to the first member 21 with the first fixing member 25.

The height of the attachment members 4 according to the present embodiment can be easily adjusted even on an inclined surface such as a roof where performing a task is comparatively difficult. Thus, working time taken to install the solar cell array 1 can be reduced.

<Method of Adjustment in X/Y-Directions>

Next, a procedure in which fixing positions of the third member 23 and the fourth member 24 in the X- and Y-directions are adjusted is described in detail below with reference to FIG. 6.

Figure 6:
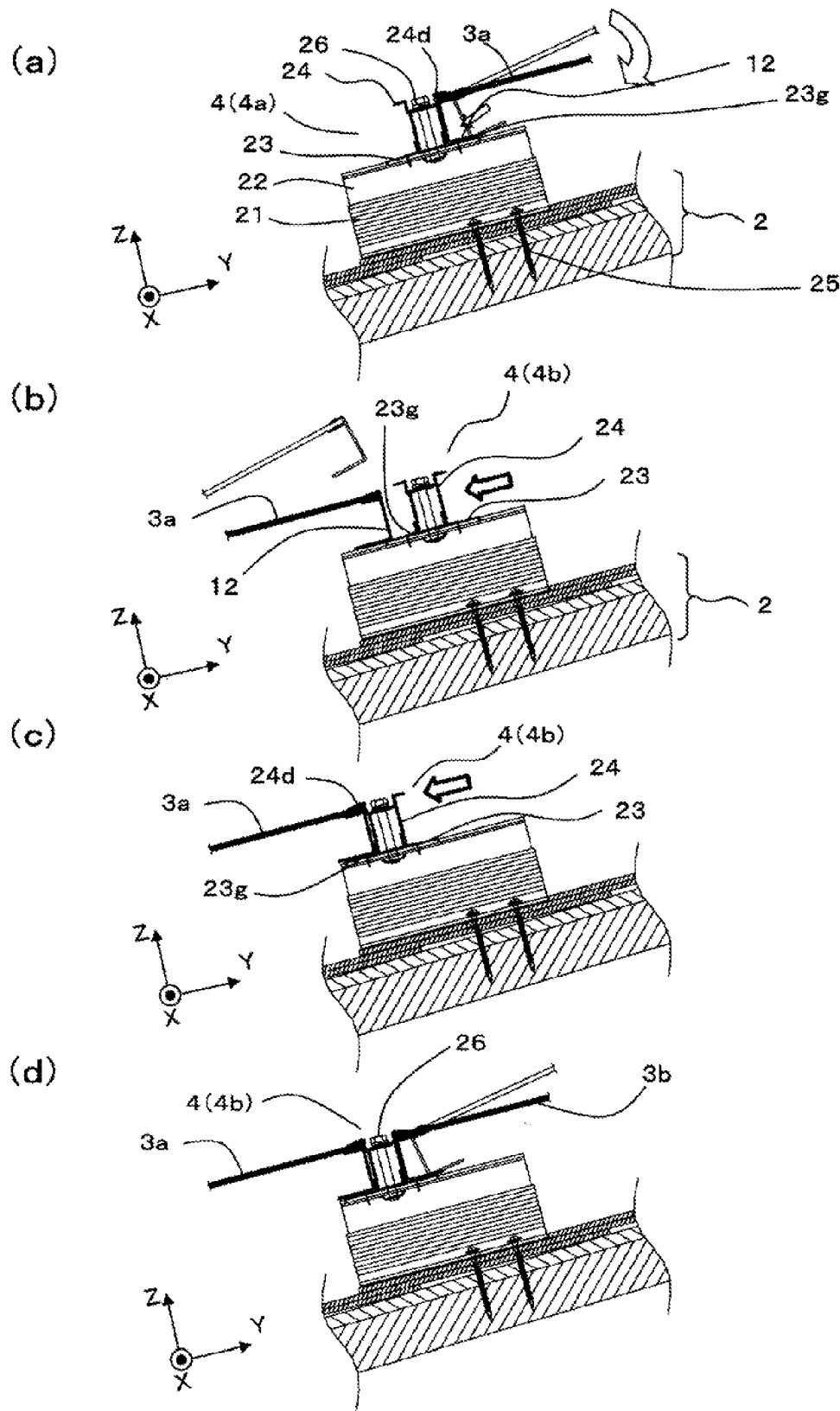
FIG. 6 includes sectional views (a) to (d) explaining installation steps of the solar cell array according to the first embodiment in the order from (a) to (d).

As illustrated in view (a) of FIG. 6, with the second fixing member 26 of the attachment member 4$a$, which is in the first row from the eave side of the base 2, the positions of the second member 22, the third member 23, and the fourth member 24 are fixed. At this time, adjustment is made so that the fourth member 24 is positioned between the solar cell modules 3 adjacent to each other in the X-direction (see view (c) of FIG. 1). Next, the eave-side frame 12 of the solar cell module 3$a$ is inserted into a gap between the pressure fixing portion 24$d$ and the mount portion 23$g$.

At this time, the gap between the pressure fixing portion 24$d$ and the mount portion 23$g$, between which the eave-side frame 12 of the solar cell module 3$a$ is clamped, may be slightly larger than the eave-side frame 12. This allows the solar cell module 3$a$ to be inserted without loosening the second fixing member 26.

Next, as illustrated in view (b) of FIG. 6, the solar cell module 3$a$ is turned toward the base 2, and the frame 12 of the solar cell module 3$a$ is placed on the mount portion 23$g$ of the attachment member 4$b$ positioned in the second row.

Next, as illustrated in view (c) of FIG. 6, the third member 23 of the attachment member 4$b$ in the second row is moved in the Y-direction toward the eave side while the position of the attachment member 4$b$ in the X-direction is adjusted so that the attachment member 4$b$ is positioned between the solar cell modules 3 adjacent to each other. Next, the ridge side of the solar cell module 3$a$ is clamped between the pressure fixing portion 24$d$ and the mount portion 23$g$ of the attachment member 4$b$.

Next, the second fixing member 26 of the attachment member 4$b$ in the second row is firmly tightened, thereby fixing the ridge side of the solar cell module 3$a$ with the attachment member 4$b$.

The installation of the solar cell modules 3 in the second row and rows after the second row is performed in a method similar to the method with which the solar cell modules 3 in the first row is installed, and description thereof is omitted (see view (d) of FIG. 6).

As described above, according to the present embodiment, the solar cell modules 3 can be fixed to the attachment members 4 by placing the solar cell modules 3 on the second members 22, moving the third members 23 and the fourth members 24 in the Y-direction, and then tightening the second fixing members 26. By doing this, the solar cell modules 3 can be fixed to the attachment members 4 without an operator moving onto the solar cell modules 3. This reduces damage to the solar cell elements 17 of the solar cell module 3$a$.

<Second Embodiment>

Figure 7:
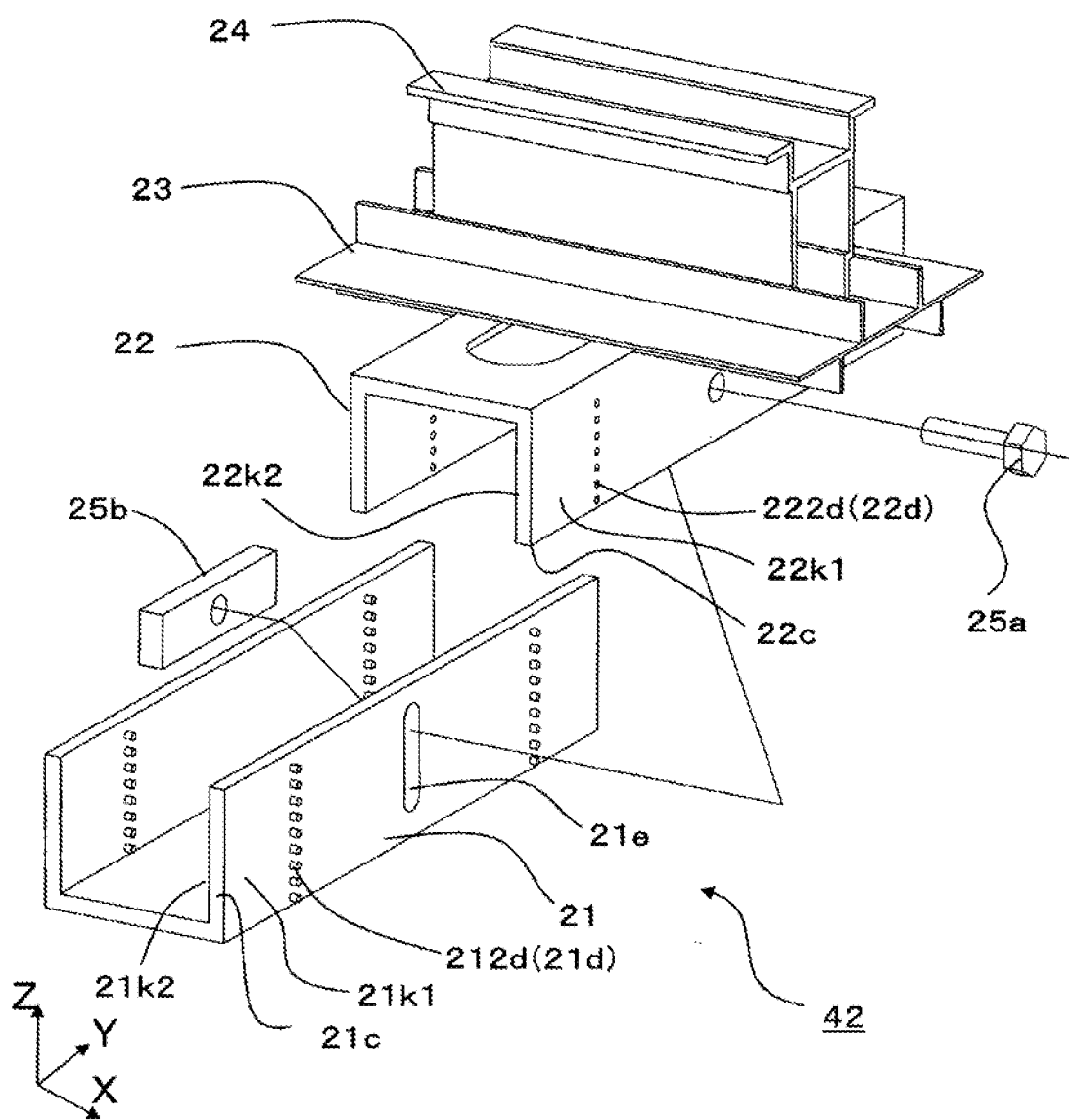
FIG. 7 is an exploded perspective view of an attachment member used in a solar cell array according to a second embodiment.

As illustrated in FIG. 7, in an attachment member 42 used in a solar cell array according to a second embodiment of the present invention, the structures of the first engagement portions 21$d$ and the second engagement portions 22$d$ are different from those of the first embodiment.

More specifically, as illustrated in FIG. 7, the first wall portions 21$c$ of the first member 21 include a plurality of projections 212$d$ as the first engagement portions 21$d$ on the first main surfaces 21$k$1. The plurality of projections 212$d$ are arranged in the height direction (Z-direction). The second wall portions 22$c$ of the second member 22 include a plurality of hole portions 222$d$ as the second engagement portions 22$d$. The hole portions 222$d$ penetrate through the first main surfaces 22$k$1 and the second main surfaces 22$k$2. The plurality of projections 212$d$ are arranged in the height direction (Z-direction) on each wall portion. Each projection 212$d$ corresponds to a corresponding one of the plurality of hole portions 222$d$. That is, the numbers of the projections 212$d$ and the hole portions 222$d$ are equal to each other, and the distance between the adjacent projections 212$d$ is substantially the same as the distance between the adjacent hole portions 222$d$. The projections 212$d$ are engageable with the hole portions 222$d$.

As described above, the first engagement portions 21$d$ and the second engagement portions 22$d$ may alternatively be a combination of the projections and hole portions engageable with one another. With such a form, the engagement forces of the first engagement portions 21*d* with the second engagement portions 22*d* are increased. That is, a supporting force resisting the self-weight of the attachment member 4 in the Z-direction is increased. It is sufficient that the height in the X-direction and width in the Y-direction of such projections be, for example, 2 to 5 mm and 3 to 7 mm, respectively. Also, it is sufficient that the shape of the projections be, for example, a square bar shape, cylindrical shape, or the like.

In the present embodiment, the hole portions may instead be formed in the first wall portions 21*c* and the projections engageable with the hole portions may instead be formed on the second wall portions 22*c*.

<Third Embodiment>

Figure 8:
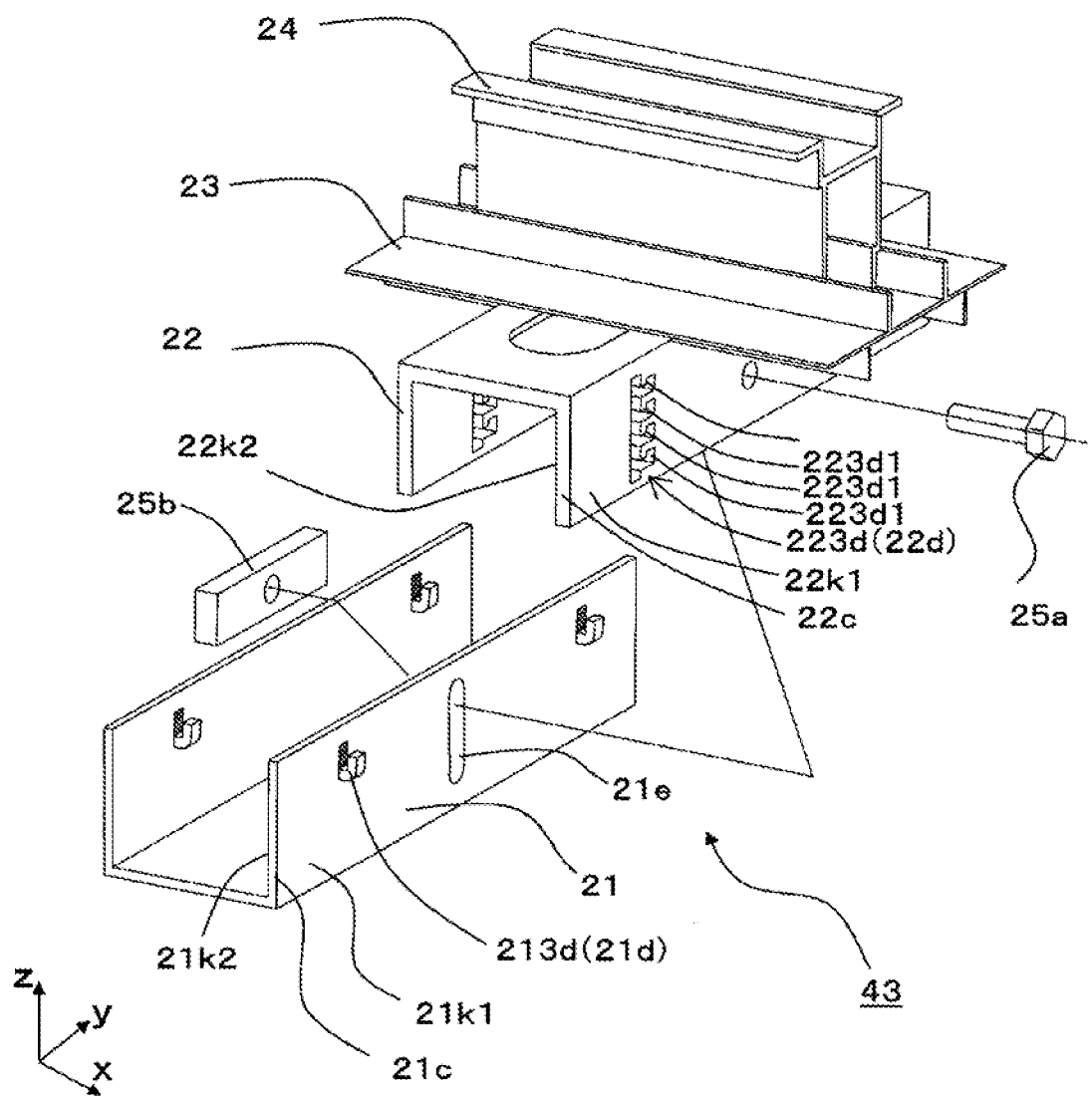
FIG. 8 is an exploded perspective view of an attachment member used in a solar cell array according to a third embodiment.

As illustrated in FIG. 8, in an attachment member 43 used in a solar cell array according to a third embodiment of the present invention, the structures of the first engagement portions 21*d* and the second engagement portions 22*d* are different from those of the first embodiment.

More specifically, as illustrated in FIG. 8, in the solar cell array according to the present embodiment, the first wall portions 21*c* of the first member 21 include hook portions 213*d* as the first engagement portions 21*d* on the first main surfaces 21*k*1. The hook portions 213*d* project from each of the first main surfaces 21*k*1 toward the second main surface 22*k*2 of a corresponding one of the second wall portions 22*c*. The second wall portions 22*c* of the second member 22 include through portions 223*d* as the second engagement portions 22*d* in the second main surfaces 22*k*2. The through portions 223*d* correspond to the hook portions 213*d* and extend in the height direction (Z-direction). The through portions 223*d* each include a plurality of engagement regions 223*d*1 arranged in the height direction. The hook portions 213*d* are engaged with the engagement regions 223*d*1.

With such a structure, the first engagement portions 21*d* and the second engagement portions 22*d* can be disengaged from one another by loosening the first fixing member 25 to an extent such as to allow the second member 22 to slide against the first member 21 without significantly shifting the second member 22 in the X-direction. This further improves efficiency of installation.

Furthermore, since the first engagement portions 21*d* have a hook shape, the movement of the second member 22 in the X-direction can be restrained and stability of a state in which the first member 21 and the second member 22 are temporarily fixed to each other can be improved in the height adjustment process. As a result, strength of the solar cell array having been installed can be improved.

<Fourth Embodiment>

Next, a solar cell array according to a fourth embodiment of the present invention is described in detail with reference to FIGS. 9 and 10.

Figure 9:
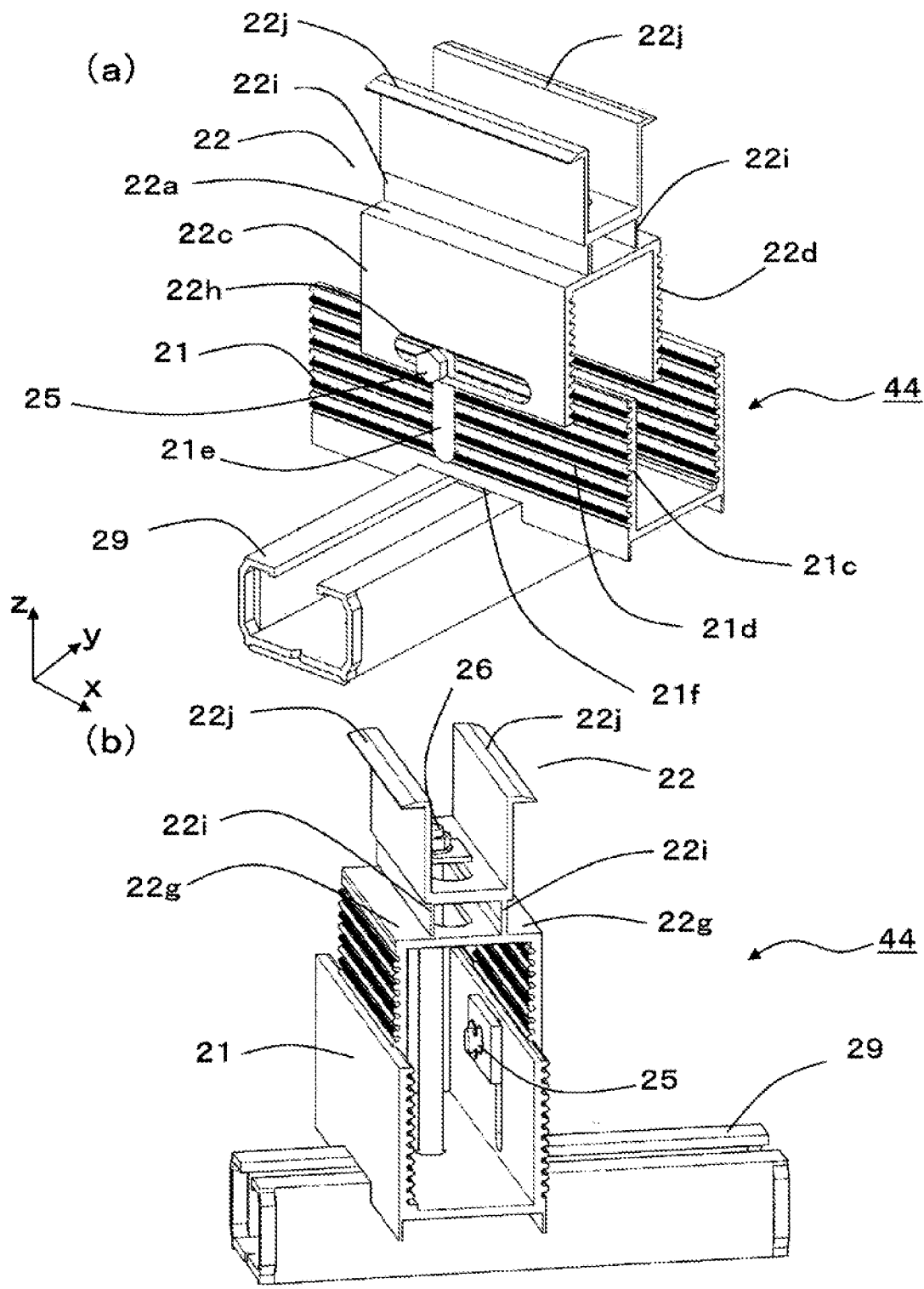
FIG. 9 includes the following views of an attachment member used in a solar cell array according to a fourth embodiment: view (a) that is a perspective view; and view (b) that is a perspective view of the attachment member illustrated in view (a) of FIG. 9 seen in the X-direction.

As illustrated in FIG. 9, an attachment member 44 used in the solar cell array according to the present embodiment includes a rail member 29. The rail member 29 is disposed on the lower side of the first member 21. As described above, in the present embodiment, the first member 21 is not directly fixed to the base 2. That is, unlike the first embodiment, the first engagement portions 21*d* and the second engagement portions 22*d* may be omitted from the attachment members 4 disposed in the lowest position and the second lowest position with respect to the base 2. As is the case with the present embodiment, even when the positions of the first engagement portions 21*d* and the second engagement portions 22*d* are changed from those of the first embodiment, the above-described effects can be obtained.

Furthermore, in the present embodiment, the first slotted hole 21*e*, which is elongated in the height direction (Z-direction), is formed in the first wall portion 21*c* of the first member 21 similarly to the first embodiment. Furthermore, in the present embodiment, as illustrated in view (a) of FIG. 9, a second slotted hole 22*h*, which is elongated in the X-direction, is formed in the second wall portion 22*c* of the second member 22 corresponding to the first wall portion 21*c* of the first member 21 that includes the first slotted hole 21*e*. Thus, by operating the first fixing member 25, the position of the second member 22 can be easily adjusted in the X- and Z-directions.

Furthermore, the first member 21 includes a guide portion 21*f* in the bottom portion 21*a*. The guide portion 21*f* is engaged with the rail member 29. As illustrated in view (a) of FIG. 9, it is sufficient that the guide portion 21*f* be defined by, for example, a notch formed in the bottom portion 21*a* and having the substantially the same dimension as that of the rail member 29 in the width direction (X-direction). With this structure, the first member 21 can be moved on the rail member 29 in the Y-direction, and accordingly, the position of the first member 21 can be adjusted.

The second member 22 has a structure on the upper portion 22*a*. This structure corresponds to the fourth member 24 of the first embodiment. The second member 22 in the present embodiment includes a pair of second side portions 22*i* and second pressure fixing portions 22*j* that project from the pair of second side portions 22*i*. As illustrated in view (a) of FIG. 10, one of the second side portions 22*i* of the second member 22 is joined to the upper portion 22*a*. The other second side portion 22*i* of the second member 22 is separated from the upper portion 22*a*. Out of the pair of second side portions 22*i* of the second member 22, the second side portion 22*i* joined to the upper portion 22*a* is disposed on the ridge side. The second side portion 22*i* separated from the upper portion 22*a* is disposed on the eave side.

In this state, similarly to the first embodiment, the solar cell module 3 is inserted into the gap between the upper portion 22*a* and second pressure fixing portion 22*j*. Thus, in the present embodiment, out of the upper portion 22*a*, portions positioned outside the pair of second side portions 22*i* function as the support surfaces 22*g* that support the solar cell module 3.

<Installation Method>

An installation method in the present embodiment is described below with reference to FIG. 10.

Figure 10:
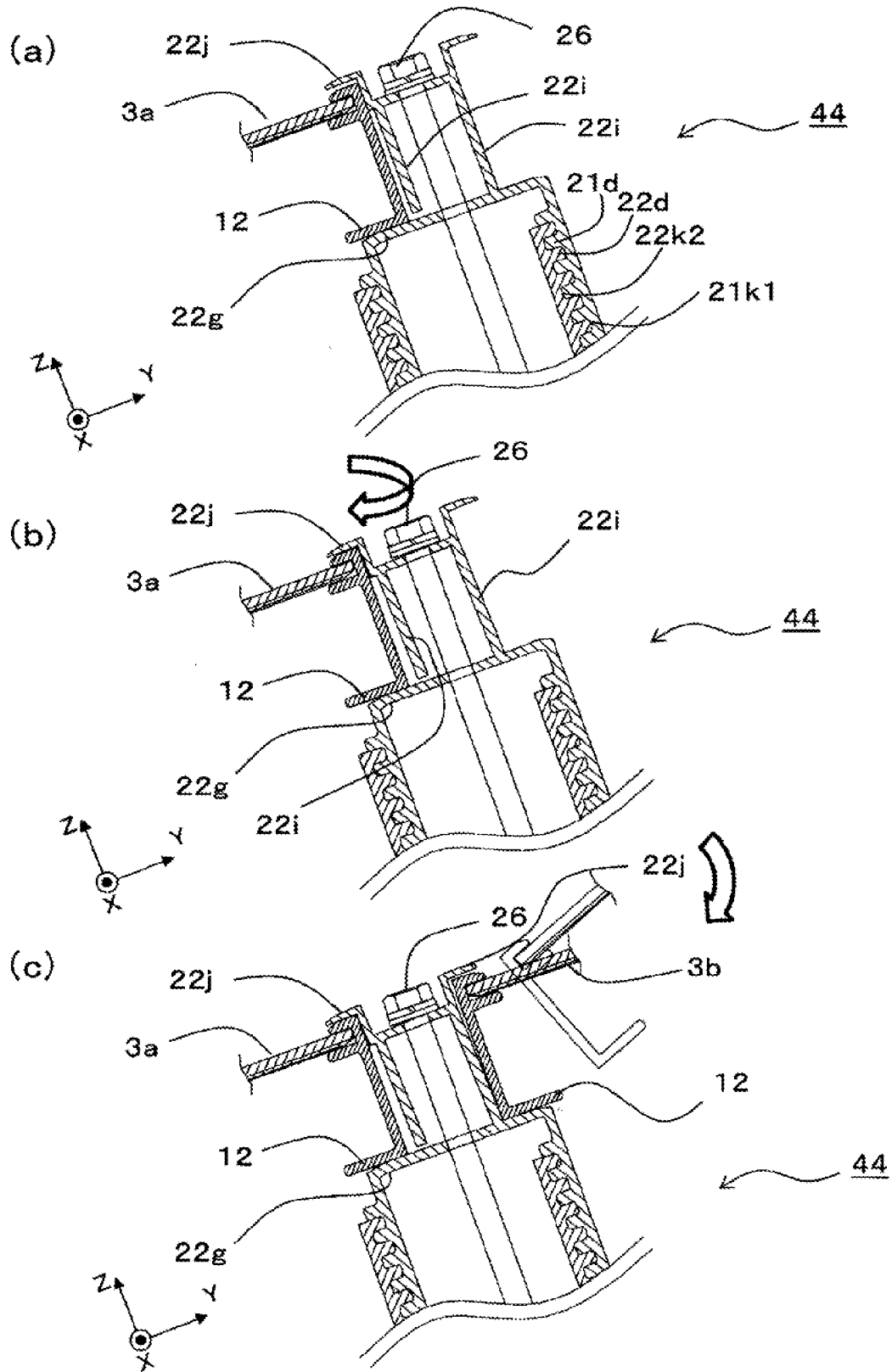
FIG. 10 includes sectional views (a) to (c) explaining installation steps of the solar cell array according to the fourth embodiment in the order from (a) to (c).

Initially, as illustrated in view (a) of FIG. 10, the ridge-side frame 12 of the solar cell module 3*a* is inserted into a gap between the second pressure fixing portion 22*j* and the support surface 22*g*. At this time, the gap between the second pressure fixing portion 22*j* and the support surface 22*g*, between which the ridge-side frame 12 of the solar cell module 3*a* is clamped, is desirably slightly larger than the dimension of the frame 12 of the solar cell module 3*a* in the height direction. This allows the solar cell module 3 to be smoothly inserted.

Next, as illustrated in view (b) of FIG. 10, the second fixing member 26 is tightened. At this time, the second pressure fixing portion 22*j* is bent and inclined toward a side where the second side portion 22*i* and the support surface 22*g* are separated from each other (eave side), thereby clamping and fixing the frame 12 of the solar cell module 3*a*.

Next, as illustrated in view (c) of FIG. 10, the ridge-side frame 12 of the solar cell module 3*b* is inserted into the gap between the second pressure fixing portion 22*j* and the support surface 22g of the second member 22. In this state, as described above, the second pressure fixing portion 22j is inclined toward the solar cell module 3a side (eave side) because of tightening of the second fixing member 26. With this structure, the gap between the second pressure fixing portion 22j and the support surface 22g is larger than the dimension of the frame 12 of the solar cell module 3b in the height direction. Thus, the solar cell module 3b can be easily inserted. Accordingly, similarly to the first embodiment, installation can be performed without an operator moving onto the solar cell modules 3.

As illustrated in FIG. 10, in the present embodiment, the first main surfaces 21k1 of the first engagement portions 21d and the second main surfaces 22k2 of the second engagement portions 22d are perpendicular to the inclination direction of the base 2. Such arrangement of the attachment members 4 on the base 2 allows the self-weight of the solar cell modules 3 exerted on the attachment members 4 to be utilized to increase the engagement forces of the first engagement portions 21d with the second engagement portions 22d.

<Fifth Embodiment>

Figure 11:
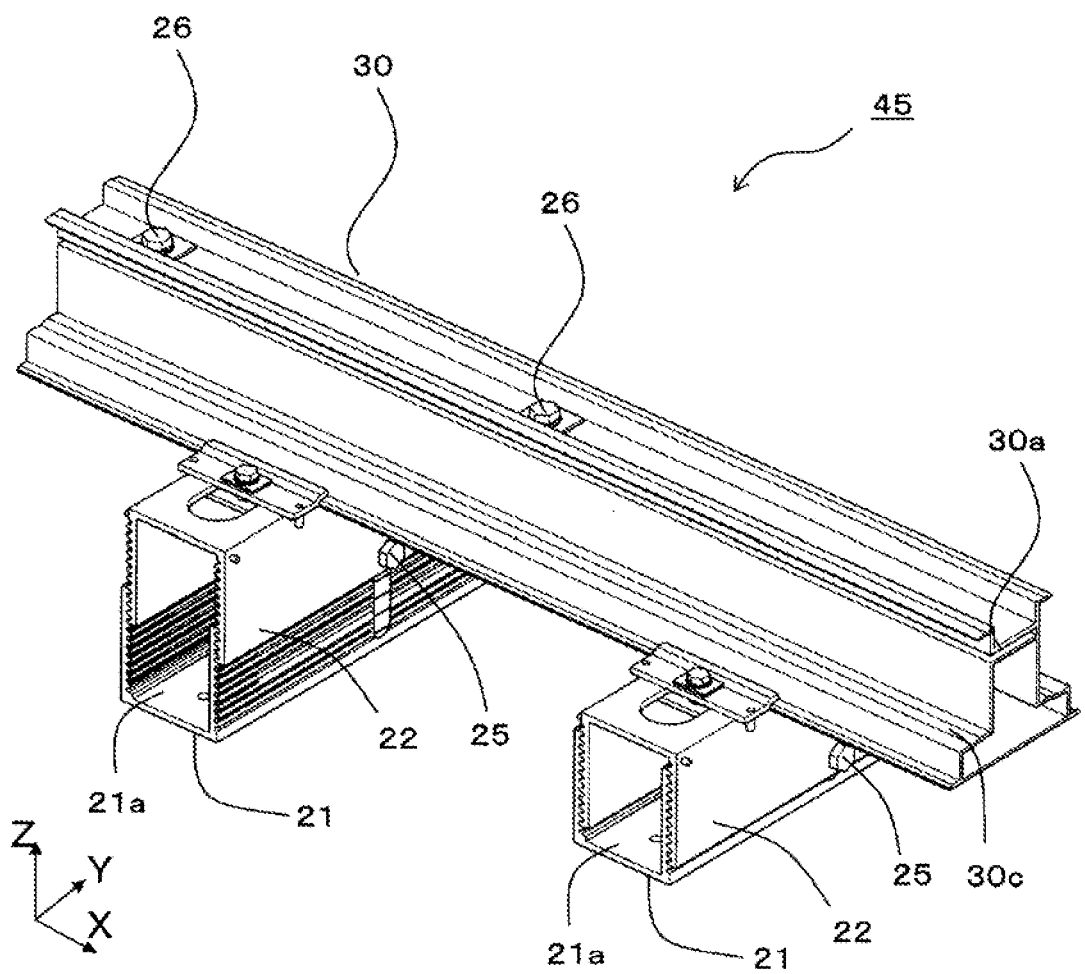
FIG. 11 is a perspective view of an attachment member used in a solar cell array according to a fifth embodiment.
Figure 12:
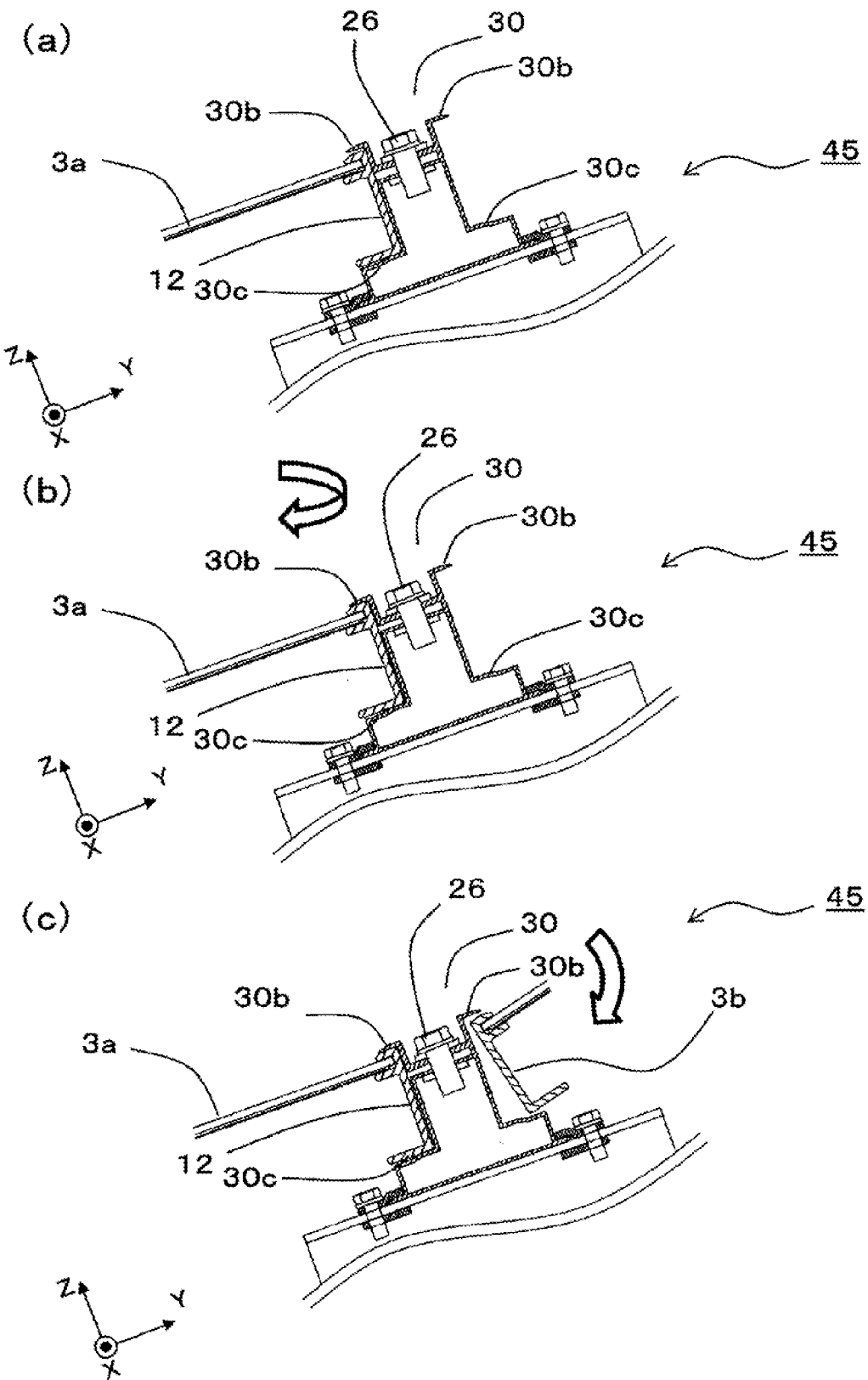
FIG. 12 includes sectional views (a) to (c) explaining installation steps of the solar cell array according to the fifth embodiment in the order from (a) to (c).

As illustrated in FIGS. 11 and 12, an attachment member 45 used in a solar cell array according to a fifth embodiment includes a fifth member 30 instead of the third member 23 and the fourth member 24 included in the attachment member 4 of the first embodiment. As illustrated in FIG. 11, the attachment member 45 includes the fifth member 30, which is structured such that the third member 23 and the fourth member 24 in the first embodiment are integrated with each other.

The fifth member 30 is elongated in the X-direction. It is sufficient that the dimension of the fifth member 30 in the X-direction be equal to or more than that of the solar cell module 3 in the X-direction. With such a shape, a plurality of the solar cell modules 3 arranged in the X-direction can be fixed by a single fifth member 30.

As illustrated in FIGS. 11 and 12, the fifth member 30 includes a void portion 30a defined between a pair of plate portions, which are substantially parallel to the bottom portions 21a of the first members 21. Thus, the fifth member 30 includes a pair of third pressure fixing portions 30b and a pair of third support surfaces 30c. In this state, in the fifth member 30, the pair of third pressure fixing portions 30b are joined to one of the plate portions and the pair of third support surfaces 30c are joined to the other plate portion.

In the present embodiment, by fastening with the second fixing member 26 the fifth member 30 having such a void portion 30a, a force, with which the frame 12 of the solar cell module 3a disposed on the eave side is clamped, is increased.

<Installation Method>

An installation method in the present embodiment is described below with reference to FIG. 12.

As illustrated in view (a) of FIG. 12, the ridge-side frame 12 of the solar cell module 3 is inserted into a gap between the third pressure fixing portion 30b and the third support surface 30c.

At this time, the gap between the third pressure fixing portion 30b and the third support surface 30c, between which the ridge-side frame 12 of the solar cell module 3a is clamped, is desirably slightly larger than the dimension of the frame 12 of the solar cell module 3a in the height direction. This allows the solar cell module 3 to be inserted without loosening the second fixing member 26.

Next, as illustrated in view (b) of FIG. 12, the second fixing member 26 is tightened. At this time, the third pressure fixing portion 30b is bent toward a side where the void portion 30a is open (eave side), thereby allowing the frame 12 of the solar cell module 3a to be clamped and fixed.

Then, as illustrated in view (c) of FIG. 12, the eave-side frame 12 of the solar cell module 3b is inserted into a gap between the third pressure fixing portion 30b and the third support surface 30c of the attachment member 45. At this time, since the third pressure fixing portion 30b is inclined toward the solar cell module 3a side (eave side), the gap between the third pressure fixing portion 30b and the third support surface 30c is larger than the dimension of the frame 12 of the solar cell module 3b in the height direction. This allows the frame 12 of the solar cell module 3b to be easily inserted. As a result, also in the present embodiment, installation can be easily performed without an operator moving onto the solar cell modules 3.

The solar cell module 3 to which the present invention can be applied is not limited to the super-straight structure solar cell module described in the foregoing embodiments. The present invention can be also applied to solar cell modules of various structures such as a glass package structure solar cell module and a substrate structure solar cell module.

The solar cell array 1 according to the present invention can be installed not only on an inclined installation surface but also on a horizontal installation surface.

The present invention is not limited to the foregoing embodiments and many modifications and changes can be made within the scope of the present invention. Of course, the present invention includes a variety of combinations of the foregoing embodiments.

REFERENCE SIGNS LIST

1: solar cell array
2: base
2a: shingle
2b: sheathing roof board
2c: rafter
3, 3a, 3b: solar cell module
4, 42, 43, 44, 45: attachment member
11: solar cell panel
11a: front surface
11b: rear surface
12: frame
13: rear surface protection member
14: translucent substrate
15: filler member
16: inner lead
17: solar cell element
18: terminal box
21: first member
21a: bottom portion
21b: first through hole
21c: first wall portion
21d, 211d, 212d, 213d: first engagement portion
211d1: curved surface portion
211d2: horizontal surface portion
21e: first slotted hole
21f: guide portion
21k: main surface
21k1: first main surface
21k2: second main surface
22: second member
22a: upper portion
22b: opening portion
22c: second wall portion
22d, 221d, 222d, 223d: second engagement portion 221d1: curved surface portion
221d2: flat surface portion
223d1: engagement region
22e: second through hole
22f: projection
22g: support surface
22h: second slotted hole
22i: second side portion
22j: second pressure fixing portion
22k: main surface
22k1: first main surface
22k2: second main surface
23: third member
23a: first main surface
23b: first fin
23d: second main surface
23e: second fin
23g: mount portion
23h: bolt hole
24: fourth member
24a: upper surface portion
24b: third slotted hole
24c: side wall portion
24d: pressure fixing portion
25: first fixing member
25a: bolt
25b: female thread member
26: second fixing member
26a: bolt
26b: female thread member
27: screw
28: adhesive member
29: rail member
30: fifth member
30a: void portion
30b: third pressure fixing portion
30c: third support surface

The invention claimed is:

1. An attachment member, comprising:
a first member comprising:
  a bottom plate; and
  first and second side walls that face each other, that are connected to two sides of the bottom plate opposite to each other, respectively, and that extend upward from the bottom plate, the first and second side walls each comprising an inner surface and an outer surface;
a first engagement portion on the inner surface of the first side wall, comprising a plurality of first engaging elements;
a second engagement portion on the outer surface of the second side wall, comprising a plurality of second engaging elements;
a second member disposed on the first member, and comprising:
  a top plate facing the bottom plate; and
  third and fourth side walls that face each other, that are connected to two sides of the top plate, and that extend downward from the top plate, the third and fourth side walls each comprising an inner surface and an outer surface;
a third engagement portion on the outer surface of the third side wall, comprising a plurality of third engaging elements that engage with the first engaging elements;
a fourth engagement portion on the inner surface of the fourth side wall, comprising a plurality of fourth engaging elements that engage with the second engaging elements; and
a fixing member that fixes the second member to the first member.

2. The attachment member according to claim 1, wherein the fixing member:
fixes the first side wall with the third side wall such that the inner surface of the first side wall contacts the outer surface of the third side wall; and
fixes the second side wall with the fourth side wall such that the outer surface of the second side wall contacts the inner surface of the fourth side wall.

3. The attachment member according to claim 2, wherein either the first and second side walls or the third and fourth side walls comprise a vertical slotted hole elongated in the height direction, and the fixing member is inserted through each of the vertical slotted hole.

4. The attachment member according to claim 1, wherein the first engagement portion comprises a first serration, and the second engagement portion comprises a second serration engageable with the first serration at a plurality of positions in the height direction.

5. The attachment member according to claim 4, wherein the first serration and the second serration each comprise:
a plurality of horizontal surface portions substantially parallel to the bottom plate; and
a connecting surface portion that comprises a curved portion and that connects the horizontal surface portions to each other.

6. The attachment member according to claim 1, wherein the first and second engagement portions comprise a plurality of projections that project from the inner and outer surfaces, respectively, and the third and fourth engagement portions comprise a plurality of holes that receive the plurality of projections.

7. The attachment member according to claim 6, wherein each of the plurality of projections comprises a hook, each of the plurality of holes comprises an engagement portion that is engageable with the hook.

8. The attachment member according to claim 3, wherein the other pair of the first side walls and the second side walls each comprises a second slotted hole elongated in a direction parallel to the bottom plate and the top plate.

* * * * *